(12) United States Patent
Suzuki et al.

(10) Patent No.: US 8,878,190 B2
(45) Date of Patent: Nov. 4, 2014

(54) SEMICONDUCTOR DEVICE AND METHOD FOR MANUFACTURING THE SAME

(75) Inventors: Mariko Suzuki, Kanagawa (JP); Tadashi Sakai, Kanagawa (JP); Naoshi Sakuma, Kanagawa (JP); Masayuki Katagiri, Kanagawa (JP); Yuichi Yamazaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 13/555,430

(22) Filed: Jul. 23, 2012

(65) Prior Publication Data

US 2013/0075757 A1 Mar. 28, 2013

(30) Foreign Application Priority Data

Sep. 26, 2011 (JP) ................................ 2011-208851

(51) Int. Cl.
| | | |
|---|---|---|
| *H01L 29/15* | (2006.01) | |
| *H01L 31/0312* | (2006.01) | |
| *H01L 29/66* | (2006.01) | |
| *H01L 29/872* | (2006.01) | |
| *H01L 21/02* | (2006.01) | |
| *H01L 29/861* | (2006.01) | |

(52) U.S. Cl.
CPC .... *H01L 21/02527* (2013.01); *H01L 29/66143* (2013.01); *H01L 29/872* (2013.01); *H01L 29/66136* (2013.01); *H01L 21/02576* (2013.01); *H01L 29/8613* (2013.01); *H01L 21/02433* (2013.01); *H01L 21/02376* (2013.01)

USPC .................. 257/77; 438/105; 257/E21.041

(58) Field of Classification Search
None
See application file for complete search history.

(56) References Cited

U.S. PATENT DOCUMENTS

| | | | |
|---|---|---|---|
| 2005/0202665 A1* | 9/2005 | Namba et al. | 438/607 |
| 2008/0193366 A1* | 8/2008 | Kato et al. | 423/446 |
| 2008/0315176 A1* | 12/2008 | Takeuchi et al. | 257/13 |
| 2011/0175109 A1 | 7/2011 | Kato et al. | |

FOREIGN PATENT DOCUMENTS

| | | |
|---|---|---|
| JP | 5-24989 | 2/1993 |
| JP | 2006-240983 | 9/2006 |

OTHER PUBLICATIONS

U.S. Appl. No. 14/090,064, filed Nov. 26, 2013, Suzuki, et al.
Office Action issued on Jan. 7, 2014 in a counterpart Japanese Patent Application No. 2011-208851 (with English Translation).

* cited by examiner

*Primary Examiner* — Evan Pert
*Assistant Examiner* — Shaka White
(74) *Attorney, Agent, or Firm* — Oblon, Spivak, McClelland, Maier & Neustadt, L.L.P.

(57) ABSTRACT

A semiconductor device according to the present embodiment includes a diamond substrate having a surface plane inclined from a (100) plane in a range of 10 degrees to 40 degrees in a direction of <011>±10 degrees, and an n-type diamond semiconductor layer containing phosphorus (P) and formed above the surface plane described above.

8 Claims, 3 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2011-208851, filed on Sep. 26, 2011, the entire contents of which are incorporated herein by reference.

FIELD

Embodiments described herein relate generally to a semiconductor device and a method for manufacturing the same.

BACKGROUND

Diamond has drawn attention as a semiconductor device material because of its potential superior semiconductor property as well as mechanical, chemical, and thermal properties. Especially, because diamond has a band gap of about 5.5 eV at room temperature, it is expected to serve as a ultraviolet ray emitting device or an electron emitting device using negative electron affinity. Further, because of its high dielectric breakdown resistance, diamond is expected to serve as a high power device. Furthermore, because of its strong crystallinity, diamond is expected to serve as a device having high resistance to severe environmental condition especially used under a harsh condition such as high temperature or radiation.

Power devices using diamond have been well developed in recent years, and there have been some reports regarding a Schottky barrier diode having a Schottky junction, a device having a combination of a pn junction and the Schottky junction, a device having a pin structure, or the like. However, it is especially difficult to stably control a uniform impurity concentration or high crystallinity in the formation of an n-type diamond semiconductor layer. Therefore, a method for stably forming the n-type diamond semiconductor layer has been desired.

DETAILED DESCRIPTION

A semiconductor device of an embodiment has a diamond substrate having a surface plane inclined from a (100) plane in a range of 10 degrees to 40 degrees in a direction of <011>±10 degrees, and an n-type diamond semiconductor layer containing phosphorus (P) formed on the surface plane described above.

It is generally difficult to control an n-type layer of a diamond semiconductor. In the related art, n-type conduction has been achieved by doping phosphorus (P) on a (111) substrate and a (100) substrate. However, since the (111) substrate is hard, processing thereof is difficult, and thus enlargement or flattening thereof is difficult. Therefore, it is desirable to manufacture the semiconductor device by using the (100) substrate or a substrate having a plane orientation in the vicinity of the (100) substrate which are inexpensive and easy to process.

However, especially, in the growth of diamond on the (100) plane, abnormal growth particles, hillocks, and the like are likely to occur. Further, it is difficult to obtain a flat film in the phosphorus (P)-doped n-type layer. Furthermore, it is difficult to control a doping concentration, a concentration profile in the growth direction, or the like. Therefore, it has been difficult to obtain desired device properties for the semiconductor device having the n-type diamond semiconductor layer on the (100) plane.

Hereinafter, an embodiment of the present invention will be described with reference to the drawings.

Note that, in the specification, the description "(100) plane" includes a plane having a plane orientation equivalent to the (100) plane in terms of a crystal structure, such as (001) and (010). Also, a plane orientation equivalent to the [100] plane in terms of a crystal structure is described as "<100>".

The semiconductor device of the present embodiment has the diamond substrate having the plane inclined from the (100) plane in the range of 10 degrees to 40 degrees in the direction of <011>±10 degrees, and the n-type diamond semiconductor layer containing phosphorus (P) formed on the plane described above.

By having the structure described above, the semiconductor device of the present embodiment can realize the n-type diamond semiconductor layer excellent in uniformity of an impurity concentration and in crystallinity. Also, this layer is easy to form or pattern, and thus the semiconductor device can be manufactured at a low cost.

Figure 2:
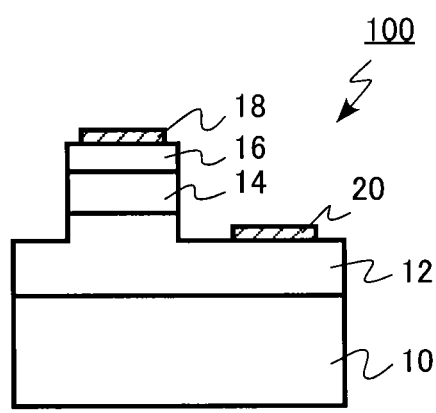
FIG. 2 is a schematic sectional view of the semiconductor device of the embodiment.

FIG. 2 is a schematic sectional view of the semiconductor device of the embodiment. The semiconductor device of the present embodiment is a pn diode.

As shown in FIG. 2, a pn diode 100 of the present embodiment has a single-crystal diamond substrate 10, a p$^+$-type diamond semiconductor layer 12 formed on the diamond substrate 10, and a p-type diamond semiconductor layer 14 formed on the p$^+$-type diamond semiconductor layer 12 and having a lower impurity concentration than the p$^+$-type diamond semiconductor layer 12. Further, an n-type diamond semiconductor layer 16 containing phosphorous (P) as an impurity is formed on the p-type diamond semiconductor layer 14.

A ridge is formed by the p$^+$-type diamond semiconductor layer 12, the p-type diamond semiconductor layer 14, and the n-type diamond semiconductor layer 16. A Schottky electrode 18 is formed on the n-type diamond semiconductor layer 16. Also, an ohmic electrode 20 is formed on the p$^+$-type diamond semiconductor layer 12 outside the ridge.

The Schottky electrode 18 is formed by metal such as nickel (Ni) that forms a Schottky junction with the n-type diamond semiconductor layer 16. Also, the ohmic electrode 20 is formed by metal such as titanium (Ti) that minimizes contact resistance to the p$^+$-type diamond semiconductor layer 12.

Here, the diamond substrate 10 has a surface plane inclined from the (100) plane in the range of 10 degrees to 40 degrees in the direction of <011>±10 degrees. Further, the p$^+$-type diamond semiconductor layer 12, the p-type diamond semiconductor layer 14, and the n-type diamond semiconductor layer 16 are formed above the surface plane in the same plane orientation.

By interposing the n-type diamond semiconductor layer 16 that has a relatively low concentration between the Schottky electrode 18 and the p-type diamond semiconductor layer 14, the pn diode 100 of the present embodiment is capable of sending a high forward current while maintaining a rectification. Especially, according to the present embodiment, by forming the n-type diamond semiconductor layer 16 containing phosphorous (P) as an impurity on the plane inclined from the (100) plane in the range of 10 degrees to 40 degrees in the direction of <011>±10 degrees, the uniformity of the phosphorous (P) concentration of the n-type diamond semiconductor layer 16 is improved. Further, the high crystallinity with less crystal defects can be realized in the n-type diamond semiconductor layer 16. A high-performance pn diode can be realized accordingly.

Next, a method for manufacturing the semiconductor device of the present embodiment will be described. The method for manufacturing the semiconductor device of the present embodiment prepares a diamond substrate having a surface plane inclined from a (100) plane in a range of 10 degrees to 40 degrees in a direction of <011>±10 degrees, and forms an n-type diamond semiconductor layer containing phosphorous (P) on the surface plane described above by an epitaxial growth method. FIGS. 3A to 3D are schematic sectional views reflecting processes for manufacturing the semiconductor device of the embodiment.

Figure 3A:
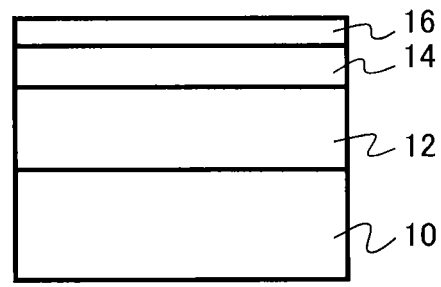
FIGS. 3A to 3D are schematic sectional views reflecting processes for manufacturing the semiconductor device of the embodiment.

First of all, a single-crystal diamond substrate 10 is prepared, the diamond substrate 10 having a surface plane inclined from a (100) plane in a range of 10 degrees to 40 degrees in a direction of <011>±10 degrees. Then, a $p^+$-type diamond semiconductor layer 12, a p-type diamond semiconductor layer 14, and an n-type diamond semiconductor layer 16 are epitaxially grown on the diamond substrate 10 by a microwave plasma CVD (Chemical Vapor Deposition) method (FIG. 3A). A phosphorous (P) concentration of the n-type diamond semiconductor layer is, for example, not less than $1 \times 10^{15}$ cm$^{-3}$.

Figure 3B:
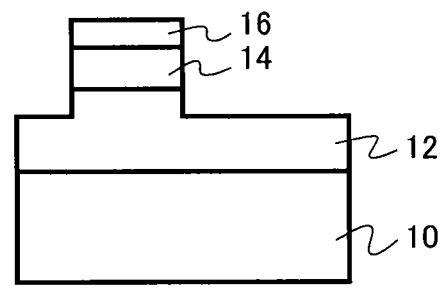

Next, the n-type diamond semiconductor layer 16, the p-type diamond semiconductor layer 14, and the $p^+$-type diamond semiconductor layer 12 are etched by, for example, a RIE (Reactive Ion Etching) method while a portion of these layers 12, 14, and 16 are left as a ridge to expose the $p^+$-type diamond semiconductor layer 12 (FIG. 3B).

Figure 3C:
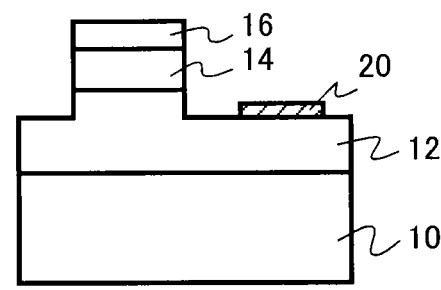

Next, titanium (Ti)/platinum (Pt)/gold (Au) is, for example, deposited by electron beam vapor deposition on the $p^+$-type diamond semiconductor layer 12. Next, annealing is carried out at 500 to 600° C. to form an ohmic electrode 20 (FIG. 3C).

Figure 3D:
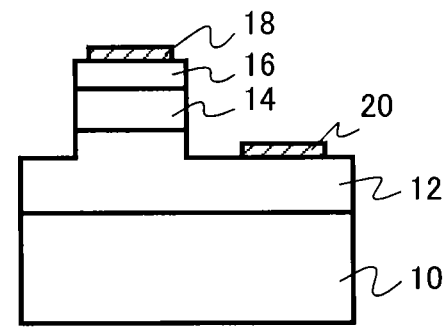

Next, nickel (Ni) is, for example, deposited by the electron beam vapor deposition on the n-type diamond semiconductor layer 16 to form a Schottky electrode 18 (FIG. 3D).

By the manufacturing method described above, the pn diode 100 shown in FIG. 2 can be realized. According to the manufacturing method of the present embodiment, the n-type diamond semiconductor layer 16 is epitaxially grown on the single-crystal diamond substrate 10 having the plane inclined from the (100) plane in the range of 10 degrees to 40 degrees in the direction of <011>±10 degrees. Consequently, it becomes possible to form the high-quality n-type diamond semiconductor layer 16 having a highly uniform impurity concentration with less crystal defects. A high-performance pn diode can be realized accordingly.

Figure 1:
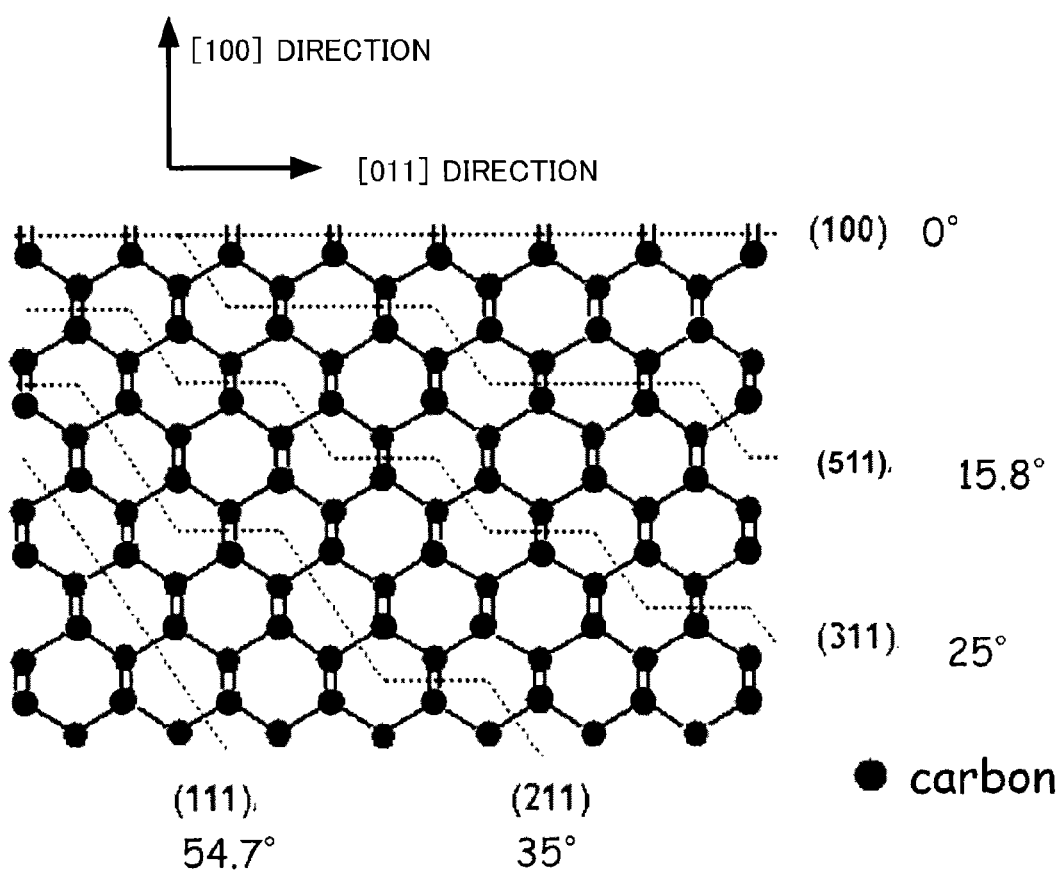
FIG. 1 is a diagram illustrating an operation of a semiconductor device of an embodiment.

FIG. 1 is a diagram illustrating an operation of the semiconductor device of the present embodiment. FIG. 1 shows a crystal structure of a single-crystal diamond substrate in section parallel with the directions of [100] and [011]. The black circle represents a carbon atom. Also, the dotted line represents a surface structure of each inclination.

As shown in FIG. 1, on a plane inclined from a (100) plane in a <011>direction, a step of a (111) plane appears on the surface. Density of the step, in other words, density of the step number is maximized when the inclination is 25 degrees. By such a step appearing on the surface, phosphorous (P) atoms stably adhered onto the step are stably incorporated into an epitaxially growing diamond film. Consequently, the high n-type impurity concentration and the high uniformity of the n-type impurity concentration of the n-type diamond semiconductor layer can be realized.

Also, it becomes possible to reduce a hillock which tends to grow in the <100>direction or a size of an abnormal growth particle, whereby flatness is improved.

Predominance of step flow growth can also reduce density of the hillock or the abnormal growth particle. Consequently, it becomes possible to reduce the crystal defects in the n-type diamond semiconductor layer.

Further, it is easy to control the concentration and the distribution (profile) of the n-type impurities in the film formation, whereby deterioration of the flatness due to thick film growth, or a delay of doping in a low concentration can be reduced.

As described above, according to the present embodiment, an n-type diamond semiconductor layer having superior properties and productivity can be formed. Therefore, the properties and the productivity of a device using the n-type diamond semiconductor layer are improved.

Note that a roughly equivalent effect to the inclination in the <011>direction can be obtained as long as an inclination from the (100) plane is in the range of ±10 degrees with respect to <011>.

Also, since the density of the step is maximized when the inclination is 25 degrees, an inclination angle (off angle) from the (100) plane in the direction of <011> ±10 degrees is 10 degrees to 40 degrees, more desirably 15 degrees to 35 degrees, and still more desirably 21 degrees to 29 degrees.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the embodiment, the n-type diamond semiconductor layer is formed on the p-type diamond semiconductor layer to form the pn junction. However, a high-purity i layer (intrinsic diamond layer) may be provided between the p-type diamond semiconductor layer and the n-type diamond semiconductor layer. Further, in the embodiment, the Schottky electrode is formed on the n-type diamond semiconductor layer. However, a pin diode structure may be adopted in which the n-type diamond semiconductor layer is replaced with a high-concentration n-type diamond semiconductor layer, the high-purity i layer is provided between the high-concentration n-type diamond semiconductor layer and the p-type diamond semiconductor layer, and the ohmic electrode is formed on the high-concentration n-type diamond semiconductor layer. Furthermore, a vertical device structure may be adopted in which a p-type conductive substrate is used as a substrate, and the ohmic electrode is formed on the reverse side of the substrate.

Embodiment

A pn diode of the present embodiment is manufactured by the method of the present embodiment. The $p^+$-type diamond semiconductor layer 12, the p-type diamond semiconductor layer 14, and the n-type diamond semiconductor layer 16 are epitaxially grown by the microwave plasma CVD method using the single-crystal diamond substrate having the plane inclined from the (100) plane by 15 degrees in the <011>direction.

The $p^+$-type diamond semiconductor layer 12 has a boron (B) concentration of $5\times10^{20}$ cm$^{-3}$, the p-type diamond semiconductor layer 14 has a boron (B) concentration of $5\times10^{19}$ cm$^{-3}$, and the n-type diamond semiconductor layer 16 has a phosphorous (P) concentration of $1\times10^{15}$ cm$^{-3}$.

A ridge is formed by the RIE method, and the ohmic electrode 20 is formed on the $p^+$-type diamond semiconductor layer 12 by depositing Ti/Pt/Au by the electron beam vapor deposition and by annealing for 15 minutes at 500° C. Next, the Schottky electrode 18 is formed on the n-type diamond semiconductor layer 16 by depositing nickel (Ni) by the electron beam vapor deposition.

Here, because of a low donor concentration, the n-type diamond semiconductor layer 16 is completely depleted in a thermal equilibrium condition due to the formation of the Schottky electrode 18.

When an I-V characteristic of the produced pn diode is measured, a rectification ratio at ±10 V of not less than 10 digits, and forward current density at 10 V of 10000 A/cm$^2$ are obtained. Also, a backward leakage current at 100 V is not more than 1 pA, and no breakdown occurs even if voltage is applied up to 500 V.

What is claimed is:

1. A semiconductor device comprising:
   a diamond substrate having a surface plane inclined from a (100) plane in a range of 10 degrees to 40 degrees, the surface plane being inclined from the (100) plane in a direction of <011>±10 degrees; and
   an n-type diamond semiconductor layer formed above the surface plane, the layer containing phosphorous (P); and
   a p-type diamond semiconductor layer formed between the diamond substrate and the n-type diamond semiconductor layer.

2. The device according to claim 1, wherein a phosphorous (P) concentration of the n-type diamond semiconductor layer is not less than $1\times10^{15}$ cm$^{-3}$.

3. A method for manufacturing a semiconductor device, comprising:
   preparing a diamond substrate having a surface plane inclined from a (100) plane in a range of 10 degrees to 40 degrees, the surface plane being inclined from the (100) plane in a direction of <011>±10 degrees;
   forming a p-type diamond semiconductor layer above the diamond substrate; and
   forming an n-type diamond semiconductor layer containing phosphorous (P) by epitaxial growth above the p-type diamond semiconductor layer.

4. The method according to claim 3, wherein a phosphorous (P) concentration of the n-type diamond semiconductor layer is not less than $1\times10^{15}$ cm$^{-3}$.

5. The method according to claim 3, wherein the n-type diamond semiconductor layer is formed by a microwave plasma CVD.

6. A semiconductor device comprising:
   a diamond substrate having a surface plane inclined from a (100) plane in a range of 15 degrees to 35 degrees, the surface plane being inclined from the (100) plane in a direction of <011>±10 degrees; and
   an n-type diamond semiconductor layer formed above the surface plane, the layer containing phosphorous (P).

7. The device according to claim 6, wherein a phosphorous (P) concentration of the n-type diamond semiconductor layer is not less than $1\times10^{15}$ cm$^{\times3}$.

8. The device according to claim 6, further comprising a p-type diamond semiconductor layer formed between the diamond substrate and the n-type diamond semiconductor layer.

* * * * *